United States Patent [19]

Shimada et al.

[11] Patent Number: 5,162,901
[45] Date of Patent: Nov. 10, 1992

[54] ACTIVE-MATRIX DISPLAY DEVICE WITH ADDED CAPACITANCE ELECTRODE WIRE AND SECONDARY WIRE CONNECTED THERETO

[75] Inventors: Yasunori Shimada, Nara; Hirohisa Tanaka, Ikoma; Hisashi Saito, Tenri; Hitoshi Ujimasa, Higashiosaka, all of Japan

[73] Assignee: Sharp Kabushiki Kaisha, Osaka, Japan

[21] Appl. No.: 527,191

[22] Filed: May 23, 1990

[30] Foreign Application Priority Data

May 26, 1989 [JP] Japan .................................. 1-133372
Jun. 30, 1989 [JP] Japan .................................. 1-170808

[51] Int. Cl.⁵ ......................... G02F 1/13; H01L 29/78
[52] U.S. Cl. ....................................... 359/59; 359/54;
359/87; 257/59; 257/61
[58] Field of Search .............. 350/333, 334, 336;
340/784 C; 359/54, 59, 87, 88; 357/4, 23.7

[56] References Cited

U.S. PATENT DOCUMENTS

| 4,582,395 | 4/1986 | Morozumi | 350/334 |
| 4,600,274 | 7/1986 | Morozumi | 350/333 |
| 4,728,176 | 3/1988 | Tsuboyama et al. | 359/62 |
| 4,955,697 | 9/1990 | Tsukada et al. | 350/333 |

FOREIGN PATENT DOCUMENTS

| 57-115856 | 7/1982 | Japan | 359/54 |
| 58-21863 | 2/1983 | Japan | 359/87 |
| 58-130561 | 8/1983 | Japan | 359/87 |
| 58-159518 | 9/1983 | Japan | 359/87 |
| 59-5229 | 1/1984 | Japan | 359/87 |
| 59-7344 | 1/1984 | Japan | 350/333 |
| 60-169828 | 9/1985 | Japan | 350/336 |
| 60-230117 | 11/1985 | Japan | 359/87 |
| 60-230118 | 11/1985 | Japan | 359/87 |
| 60-239711 | 11/1985 | Japan | 359/87 |
| 61-29820 | 2/1986 | Japan | 359/87 |
| 61-151516 | 7/1986 | Japan | 359/87 |
| 61-243430 | 10/1986 | Japan | 350/333 |
| 62-90624 | 4/1987 | Japan | 350/333 |
| 62-148929 | 7/1987 | Japan | 359/87 |
| 62-227130 | 9/1987 | Japan | 359/87 |
| 62-296123 | 12/1987 | Japan | 359/59 |
| 1-68721 | 3/1989 | Japan | 350/336 |
| 64-81262 | 7/1989 | Japan | 359/87 |
| 1-255831 | 10/1989 | Japan | 357/23.7 |

Primary Examiner—Rolf Hille
Assistant Examiner—Minhloan Tran
Attorney, Agent, or Firm—Nixon & Vanderhye

[57] ABSTRACT

An active-matrix display device having low-resistance added capacitance electrode wires in which single or plural secondary wires connected electrically to the added capacitance electrode wires reduce the apparent electrical resistance of the added capacitance electrode wires, which makes the time constant of the added capacitance electrode wires smaller, so that the charging characteristics of the added capacitance are improved and contrast and other display characteristics of the liquid crystal display device are improved.

4 Claims, 15 Drawing Sheets

FIG. 12 (PRIOR ART)
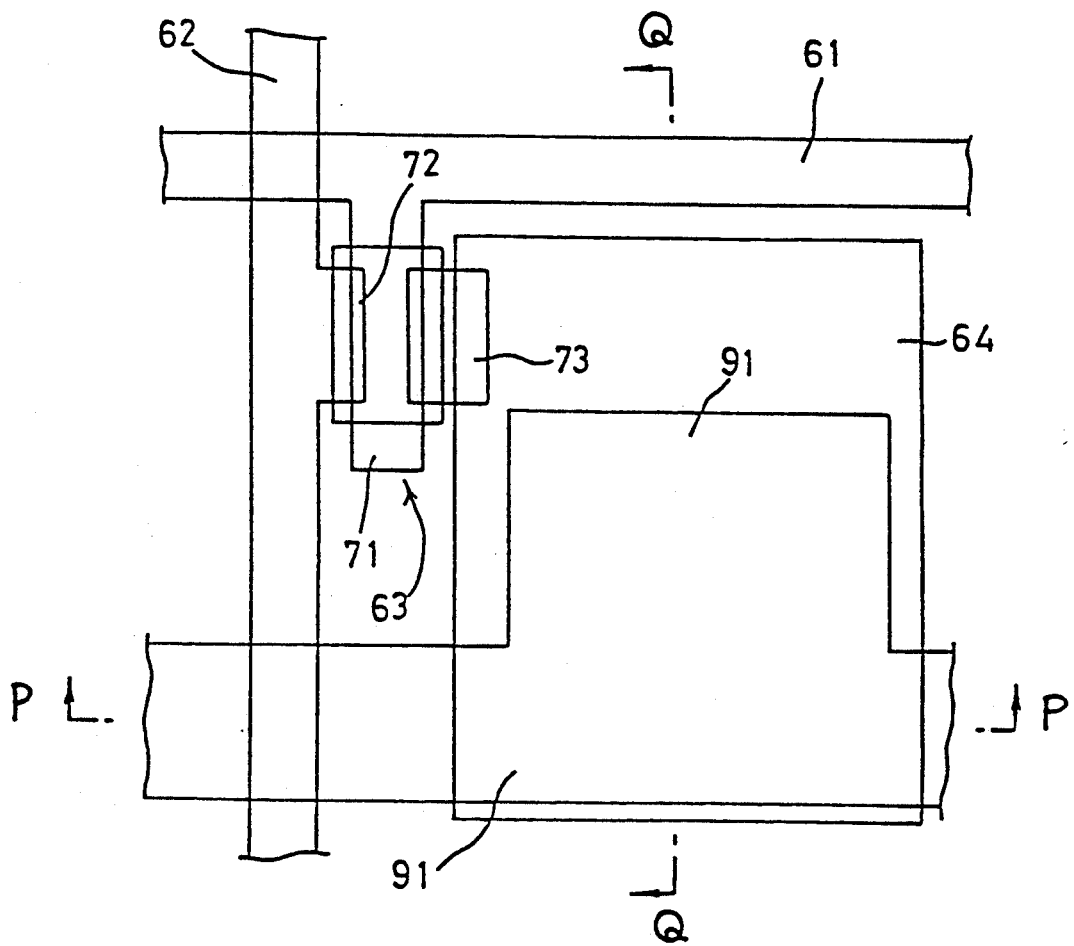
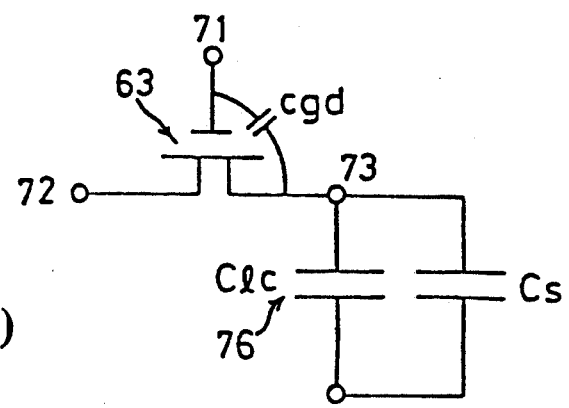
FIG. 15 (PRIOR ART)

ACTIVE-MATRIX DISPLAY DEVICE WITH ADDED CAPACITANCE ELECTRODE WIRE AND SECONDARY WIRE CONNECTED THERETO

BACKGROUND OF THE INVENTION

1. Field of the invention

This invention relates to a liquid crystal display device which executes display by applying a drive signal to picture element electrodes for display by means of switching elements. More particularly, it relates to an active-matrix display device with added capacitance used in the said liquid crystal display device and a method for the production of the display device.

2. Description of the prior art

A display pattern is formed on the screen of liquid crystal display devices, EL display devices, plasma display devices, etc., by selectively driving picture element electrodes arranged in a matrix. A voltage is applied between the selected picture element electrode and the opposing electrode positioned opposite the selected picture element electrode so as to optically modulate a display medium disposed therebetween. This optical modulation is observed as the display pattern. One drive method used to drive picture element electrodes is the active-matrix drive method wherein the independent picture element electrodes are arranged in rows and driven by switching elements that are connected with the corresponding picture element electrodes. The switching elements which selectively drive the picture element electrodes are generally thin-film transistor (TFT) elements, metal-insulator-metal (MIM) elements, MOS transistors, diodes, or varistors. Active-matrix drive systems make high-contrast displays possible and are used in liquid crystal television, word processors and computer terminal display devices.

FIG. 9A is a perspective view of an active-matrix liquid crystal display device which employs a conventional active-matrix substrate. FIG. 9B is a cross sectional view of the device of FIG. 9A taken along the line B—B. FIG. 9C is a diagram of the active-matrix substrate used in the device of FIG. 9A. The active-matrix liquid crystal display device has a liquid crystal layer 68 that is sandwiched between the active-matrix substrate 51 on which thin-film transistors (TFT) functioning as switching elements are formed and the opposing substrate 52 positioned opposite the substrate 51. The liquid crystal layer 68 is sealed by a sealant resin 70. This active-matrix substrate 51 has an insulation substrate 50, numerous parallel gate electrode wires 61 disposed on the insulation substrate 50, and numerous source electrode wires 62 which run perpendicular to the wires 61. The gate electrode wires 61 are connected to the corresponding gate electrode terminals 53 running along one edge of the substrate 50. In a similar manner, the source electrode wires 62 are connected to the corresponding source electrode terminals 54 running along another edge of the substrate 50.

As shown in FIG. 9B, the opposing electrodes 65 on the opposing substrate 56 are connected electrically via the connecting electrodes 67 to the opposing electrode terminals 55 on the substrate 50. The orientation films 69 and 69 are formed on the top of the picture element electrodes 64 on the substrate 50 and on top of the opposing electrodes 65 on the opposing substrate 56.

As shown in FIG. 9C, each of the TFTs 63 is positioned near the intersection between the gate electrode wire 61 and the source electrode wire 62. A scanning signal is supplied from the gate electrode wire 61 to the gate electrode of the TFT 63, and a video signal is supplied from the source electrode wire 62 to the source electrode of the TFT 63. The drain electrode of the TFT 63 is connected to the corresponding picture element electrode 64.

This kind of liquid crystal display device performs the display operation as described below. First, a gate ON voltage is applied to the gate electrode wires 61, and all of the TFTs 63 connected to the gate electrode wires 61 become ON. At the same time, a voltage corresponding to the video signal in synchronism with the gate ON signal is applied to the picture element electrodes 64 via the source electrode wires 62. Next, a gate OFF voltage is applied to the above-mentioned gate electrode wires 61, and all of the TFTs 63 connected to these electrode wires 61 become OFF. When the TFTs 63 become OFF, the charge stored in the picture element electrodes 64 is retained. The period of time for which the charge is stored is dependent on the time constant determined by the electrical capacitance of the liquid crystal cell composed of the picture element electrodes 64, the opposing electrodes 65, the liquid crystal layer 68, etc., and the OFF resistance of the TFTs 63. This display operation is repeatedly performed on the gate electrode wires 61 to display the video image on the display device.

However, it is known that the charge retained by the picture element electrodes 64 drops due to the action of the TFTs 63. This drop in voltage is explained using FIG. 10 showing a portion of the TFT 63. FIG. 11 is an equivalent circuit of the TFT 63 of FIG. 10. An amorphous silicon intrinsic semiconductor layer (hereinafter, referred to as a-Si(i) layer) 9 which functions as an electron transit layer is formed as part of the gate electrode wires 61 on the gate electrodes 71 in a manner to sandwich an insulation film therebetween, and then on top of the semiconductor layer 9, the source electrodes 72 connected to the source electrode wires 62 and the drain electrodes 73 connected to the picture element electrodes 64 are formed. A liquid crystal cell 76 is formed between the picture element electrodes 64 and the opposing electrodes 65 (not shown).

The above-mentioned voltage drop is due to the parasitic capacitance Cgd which forms in the area of the part S1 where the drain electrodes 73 and the gate electrodes 71 overlap each other. As shown in FIG. 11, the parasitic capacitance Cgd is formed parallel to the TFT 63. The drop $V_{shift}$ in the potential of the drain electrodes 73 due to the parasitic capacitance Cgd is given by the following equation.

$$V_{shift} = \frac{Cgd}{Cgd + Clc} \times V_{gate}$$

wherein Clc is the electrical capacitance due to the liquid crystal cell 76 and the $V_{gate}$ is the potential difference between the ON signal and the OFF signal applied to the gate electrodes 71.

Due to the presence of this parasitic capacitance Cgd in the TFT 63, when the signal applied to the gate electrodes 71 changes from an ON signal to an OFF signal, the potential difference between the ON signal and the OFF signal is divided by the ratio of the parasitic capacitance Cgd to the capacitance Clc of the liquid crystal cell. Therefore, the potential of the drain electrodes 73 i.e., the potential of the picture element electrodes 64, drops by the amount indicated by $V_{shift}$ in the above equation.

In order to make the $V_{shift}$ value small, electrodes 9 1 for added capacitance made from a transparent conductive film are often disposed below the picture element electrodes 64 as shown in FIG. 12. FIGS. 13 and 14 are cross sectional views taken along the lines P—P and Q—Q of FIG. 12. As shown in FIG. 12, the added capacitance electrode wires 91 are parallel to the gate electrode wires 61, and the added capacitance electrode wires 91 positioned below the picture element electrodes 64 are wider than connecting portions for connecting one added capacitance electrode wire to the adjacent added capacitance electrode wire. As shown in FIGS. 13 and 14, the added capacitance electrode wires 91 are formed below a gate insulation film 101 that has been formed under the picture element electrodes 64. The added capacitance $C_S$ forms between parts of the added capacitance electrode wires 91 and the picture element electrodes 64. FIG. 15 is an equivalent circuit on the substrate in FIG. 12. As shown in FIG. 15, since the added capacitance $C_S$ is disposed parallel to the liquid crystal cell capacitance Clc, the above-mentioned voltage drop $V_{shift}$ is given by the following equation.

$$V_{shift} = \frac{C_{gd}}{C_{gd} + Clc + C_s} \times V_{gate}$$

By including an added capacitance $C_S$ in this manner, the voltage drop $V_{shift}$ can be made small.

However, the added capacitance electrode wires 91 are made from ITO, $SnO_2$, and other types of transparent conductive films, so they have a larger resistance than do the metal films used for the gate electrode wires 61, etc. When the electrical resistance of the added capacitance electrode wires 91 is large, the time constant of the added capacitance $C_S$ becomes large, which prevents the storage of a sufficiently large charge while the ON signal is being applied to the gate electrodes 71 of the TFT 63. This tendency becomes more pronounced when the display device is made larger because the total length of the added capacitance electrode wires 91 becomes longer. Moreover, as the resolution of the display screen is increased, the number of gate electrode wires 61 increases, so it becomes necessary to shorten the length of time the ON signal is applied to the gate electrodes 71.

SUMMARY OF THE INVENTION

The active-matrix display device of this invention, which overcomes the above-discussed and numerous other disadvantages and deficiencies of the prior art, comprises a pair of insulation substrates that face each other, picture element electrodes that are arranged in a matrix in the inner surface of one of said substrates, an added capacitance electrode wire made of a transparent conductive film that faces each of said picture element electrodes so as to sandwich at least one insulation film therebetween, and a secondary wire that is disposed above said added capacitance electrode wire, said secondary wire being electrically connected to said added capacitance electrode wire.

In one embodiment the secondary wire is disposed above said added capacitance electrode wire so as to sandwich an insulation film therebetween, said insulation film having a connection groove by which said added capacitance electrode wire and said secondary wire are electrically connected to each other, and an anode oxidation film being disposed on said secondary wire.

The method for the production of active-matrix display devices of this invention comprises forming a conductive layer on the inner surface of said one substrate, patterning said conductive layer to form the gate electrode of each of said thin film transistors and a secondary wire, forming said added capacitance electrode wire to cover said secondary wire therewith, forming said insulation film on said added capacitance electrode wire, and forming said picture element electrode on said insulation film.

Alternatively, the method for the production of active-matrix display devices of this invention comprises forming the added capacitance electrode wire on the inner surface of said one substrate, forming a first insulation film on said added capacitance electrode wire, forming a connection groove in said first insulation film, forming a conductive layer on the entire surface of said first insulation film including said connection groove, patterning said conductive layer to form the gate electrode of each of said thin film transistors and a secondary wire that covers said connection groove therewith, forming a second insulation film on the entire surface of said first insulation film on which said secondary wire has been formed, and forming said picture element electrode on said second insulation film.

Alternatively, the method for the production of active-matrix display devices of this invention comprises the scanning lines each of which is electrically connected to a connection terminal at its one end are disposed alternatively in the opposite direction in a parallel manner, and said secondary wire is composed of first parts that are electrically connected to said corresponding added capacitance electrode wires so as to be parallel to said scanning lines and second parts that electrically connect with said first parts of said secondary wire so that said secondary wire is positioned in a zigzag manner.

In one embodiment, the secondary wire is positioned to be divided into plural portions.

Thus, the invention described herein makes possible the objectives of (1) providing an active-matrix display device with low-resistance added capacitance electrode wires in which single or plural secondary wires connected electrically to the added capacitance electrode wires reduce the apparent electrical resistance of the added capacitance electrode wires, which makes the time constant of the added capacitance electrode wires smaller, so that the charging characteristics of the added capacitance are improved and contrast and other display characteristics of the liquid crystal display device are improved; (2) providing an active-matrix display device with added capacitance electrode wires, in which single or plural secondary wires are formed on the added capacitance electrode wires made of transparent conductive films so as to sandwich an insulation film therebetween and the added capacitance electrode wires and secondary wires are connected electrically through connection grooves which are openings formed in the insulation film, and moreover an anodic oxide film is formed on the secondary wires, so that the picture element electrodes and secondary wires can be fully insulated; (3) providing an active-matrix display device with added capacitance electrode wires, in which single or plural secondary wires connected electrically to the added capacitance electrode wires are positioned in a zigzag manner, and accordingly it is not necessary to add another process for electrically connecting the secondary wires on the substrate; (4) providing an active-matrix display device with added capacitance electrode wires, in which the occurrence of insulation failure in the added capacitance electrode wires can be reduced, thus improving the yield of an active matrix substrate; (5) providing a method for the production of active-matrix display devices with low-resistance added capacitance electrode wires in which single or plural secondary wires connected electrically to the added capacitance electrode wires are formed at the same time the gate electrode wires of thin film transistors are formed on a glass substrate, and accordingly a new production process for forming the secondary wires need not be added and a liquid crystal display device with secondary wires can be produced using conventional production processes; and (6) providing a method for active-matrix display devices with low resistance added capacitance electrode wires, which produces active-matrix substrates with secondary wires for the added capacitance electrode wires without increasing in production processes, which makes it possible to reduce the cost of the active-matrix display devices.

BRIEF DESCRIPTION OF THE DRAWINGS

This invention may be better understood and numerous objects and advantages will become apparent to those skilled in the art by reference to the accompanying drawings as follows:

FIG. 12 is a plan view showing a conventional active-matrix substrate with added capacitance.

FIG. 15 is an equivalent circuit diagram of the substrate of FIG. 12.

DESCRIPTION OF THE PREFERRED EMBODIMENTS

EXAMPLE 1

Figure 1A:
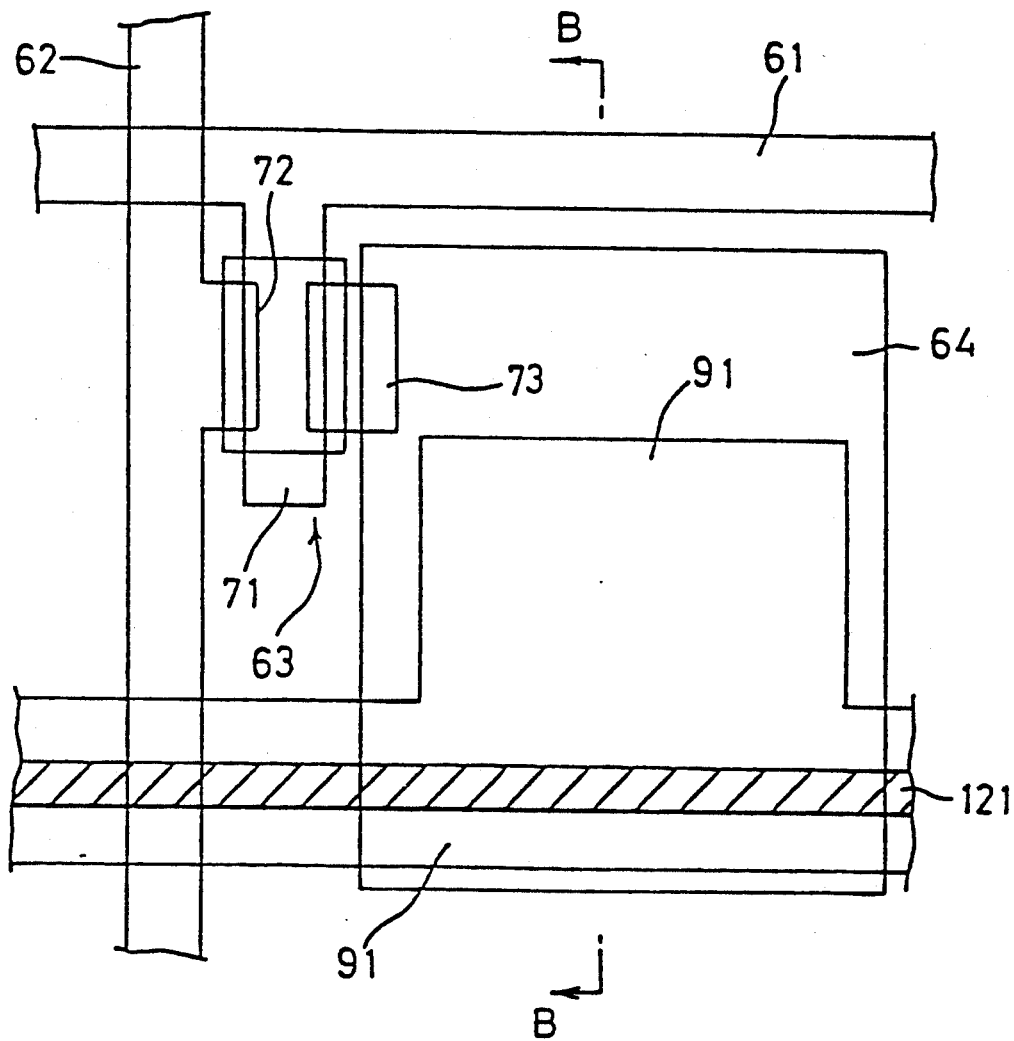
FIG. 1A is a plan view showing an active-matrix substrate used in this invention.
Figure 1B:
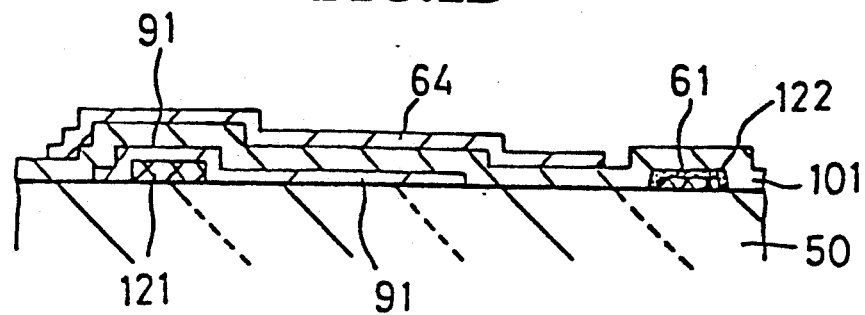
FIG. 1B is a sectional view taken along line B—B of FIG. 1A.

FIG. 1A is a plan view of the active-matrix substrate used in an active-matrix display device of this invention. FIG. 1B is a cross sectional view of the substrate taken along line B—B of FIG. 1A.

FIGS. 2A through 2D and FIGS. 3A through 3D show a production process of the active-matrix substrate of FIG. 1A. FIGS. 2A-2D are plan views showing the entire substrate of FIG. 1A and FIGS. 3A-3D are sectional views taken along line B—B of FIG. 1A.

Figure 2A:
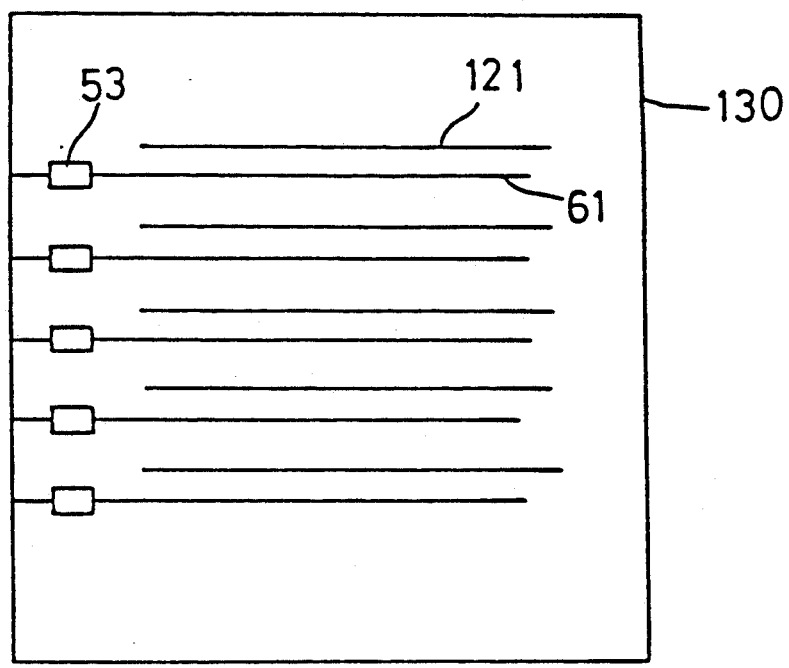
FIGS. 2A-2D are schematic diagrams showing a production process of conventional substrates.
Figure 3A:
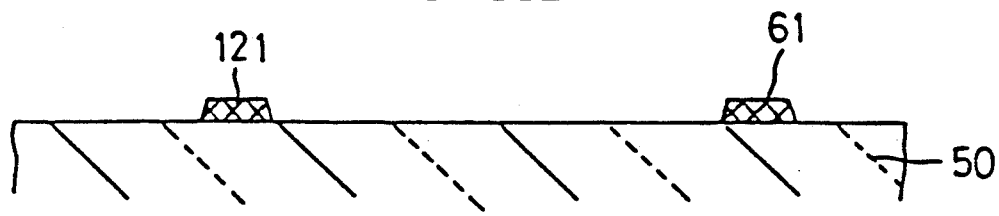
FIGS. 3A-3D are schematic diagrams showing a production process of the substrate of FIG. 1A.

First, as shown in FIGS. 2A and 3A, gate electrode wires 61, gate electrode terminals 53, secondary wires 121, and a peripheral wire 130 are formed by a metal film on a glass substrate 50. The gate electrode terminals 53 are positioned on the ends of the gate electrode wires 61. The gate electrode terminals 53 are connected to the peripheral wire 130. The peripheral wire 130 is positioned around the area where the gate electrode wires 61 and the secondary wires 121 are formed.

Figure 3B:
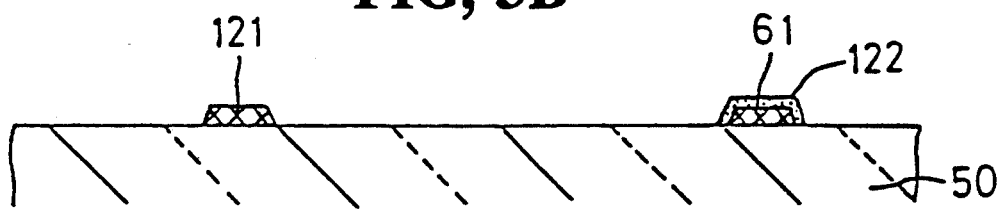

Next, an anodic oxide film 122 is formed on the gate electrode wires 61 by anodic oxidation (FIG. 3B). Anodic oxidation of the gate electrode wires 61 is performed by current flow via the peripheral wire 130. Therefore, all of the gate electrode wires 61 undergo anodic oxidation at the same time.

Figure 2B:
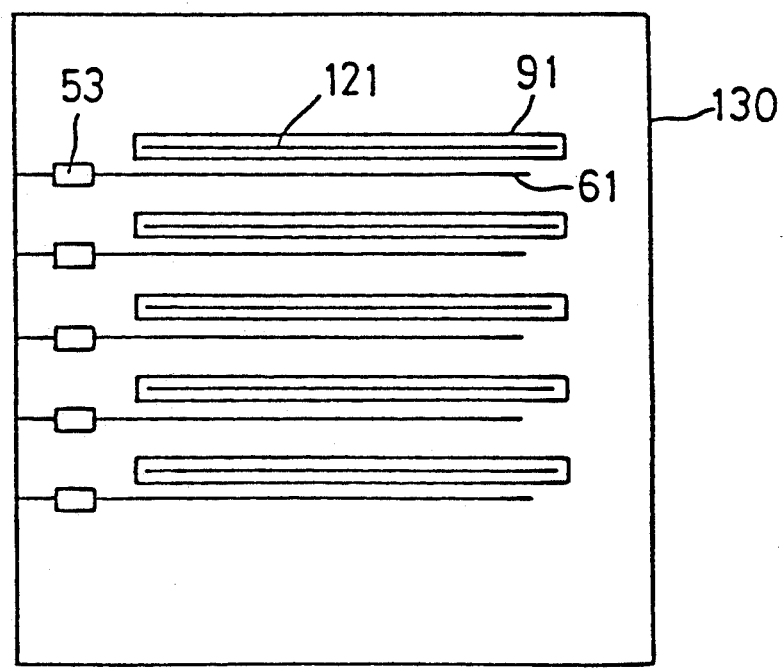
Figure 3C:
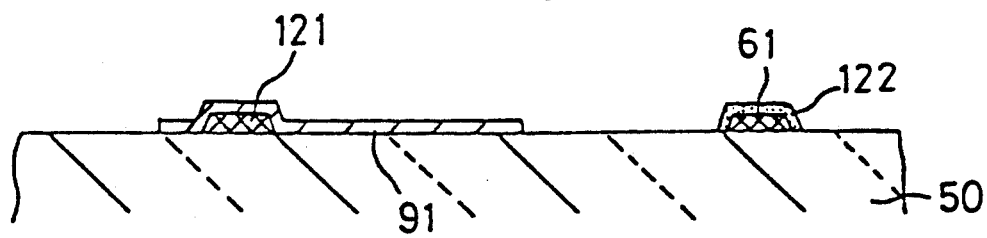

The added capacitance electrode wires 91 made of a transparent conductive film of ITO, $SnO_2$, etc., are then formed so they cover the secondary wires 121 as shown in FIGS. 2B and 3C. Part of each of the added capacitance electrode wires 91 functions as an added capacitance electrode. The shape of the added capacitance electrode wire 91 in FIG. 1A is shown in a rectangular shape in FIG. 2B to simplify the diagram. The thickness of the added capacitance electrode wires 91 is 500-2000 Å.

Figure 2C:
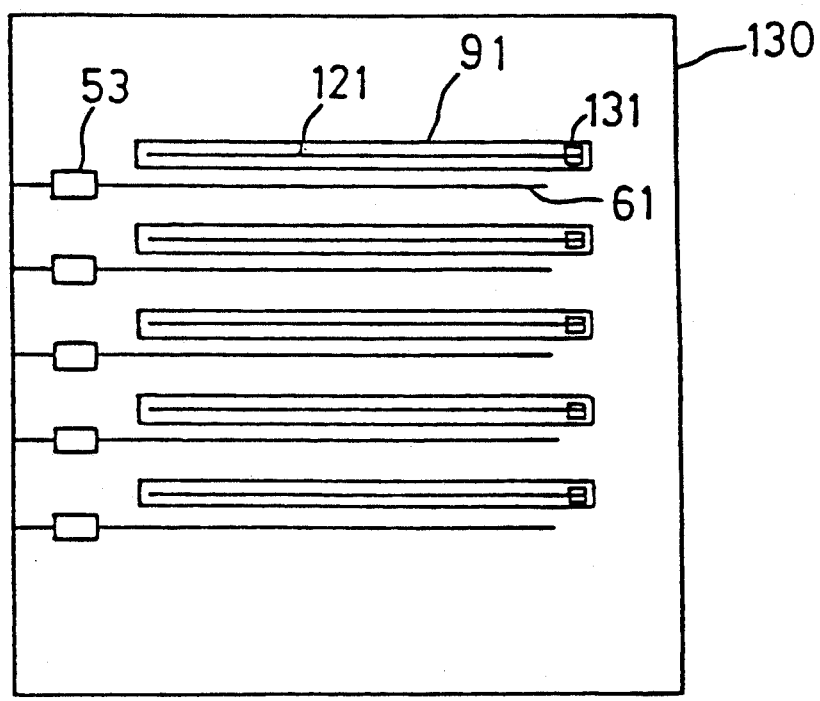
Figure 2D:
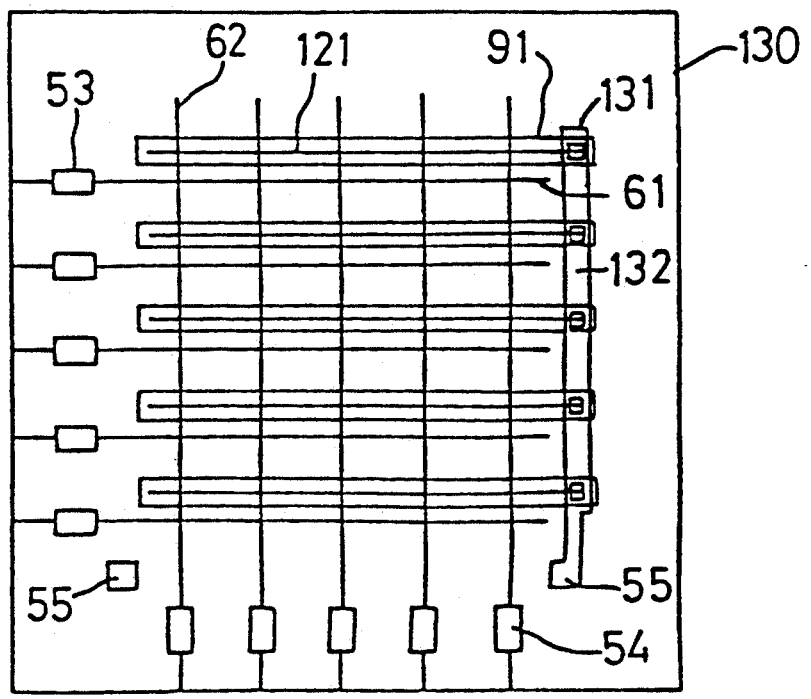
Figure 3D:
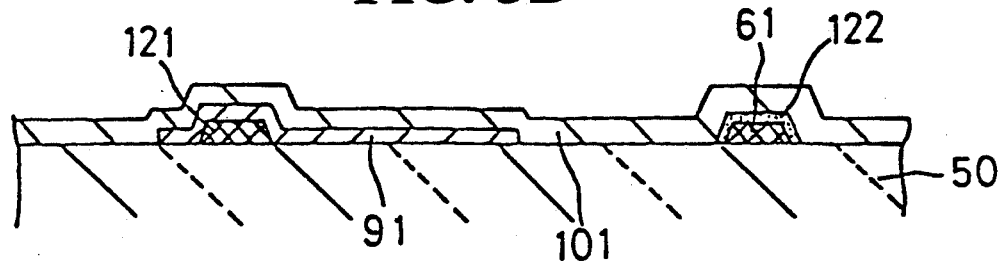

A gate insulation film 101 of $SiO_2$, SiNx, etc., is then laid over the entire surface of the substrate 50 (FIG. 3D). The areas of gate insulation film 101 above the ends of the added capacitance electrode wires 91 are removed to make connection holes 131 (FIG. 2C). Next, as shown in FIG. 2D, a connection wire 132 which electrically connects the added capacitance electrode wires 91 through each of the connection holes 131, opposing electrode terminals 55, source electrode wires 62, and source electrode terminals 54 are formed at the same time. One end of the connection wire 132 is electrically connected to the opposing electrode terminal 55, and when assembled as a display device, it is electrically connected to the opposing electrode. The source electrode terminals 54 are electrically connected to one end of each of the source electrode wires 62. As shown in FIG. 1B, the picture element electrodes 64 are formed over the added capacitance electrode wires 91 in a manner so as to sandwich a gate insulation film 101 therebetween, and the peripheral wire 130 is separated from the gate electrode terminals 53 and the source electrode terminals 54 to yield the active-matrix substrate in FIG. 1A.

However, as shown in FIG. 1B, the added capacitance electrode wires 91 and gate insulation film 101 are formed on the stepped part of the secondary wires 121, so there is a greater tendency that the covering of the added capacitance electrode wires 91 by the gate insulation film 101 becomes less complete than when there are no secondary wires 121. Moreover, it is also possible for the insulation to become defective due to pin holes which form in the gate insulation film 101, which causes more serious defects such as line defectives.

EXAMPLE 2

Figure 4A:
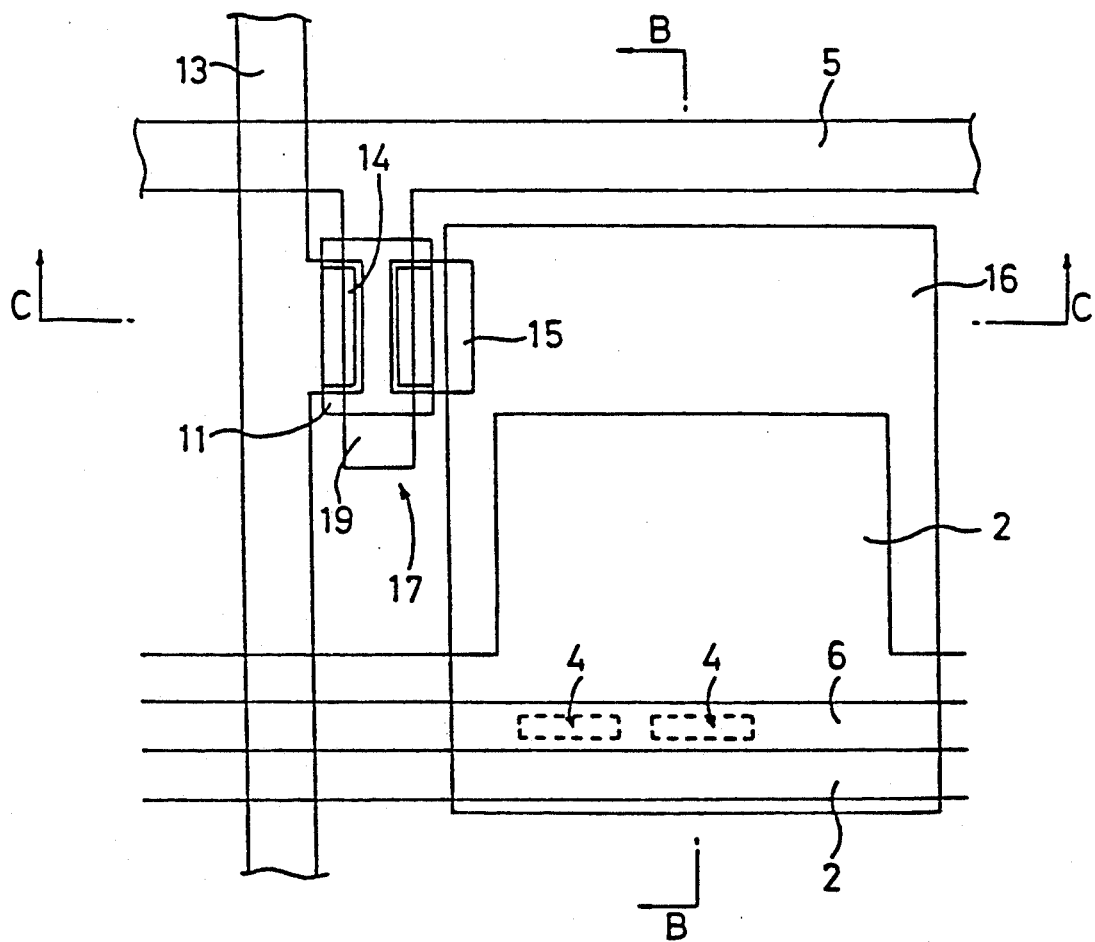
FIG. 4A is a plan view showing another active-matrix substrate used in this invention.

FIG. 4A is a plan view of an example designed to solve the above-mentioned problem. TFTs 17 are formed as switching elements on the gate electrodes 19 connected to the gate electrode wires 5, the source electrodes 14 of the TFTs 17 are connected to the source electrode wires 13, and the drain electrodes 15 thereof are connected to picture element electrodes 16. The gate electrode wires 5 and the source electrode wires 13 intersect to sandwich a gate insulation film 8 therebetween, which will be described below. The added capacitance electrode wires 2 are positioned below the picture element electrodes 16.

Figure 4B:
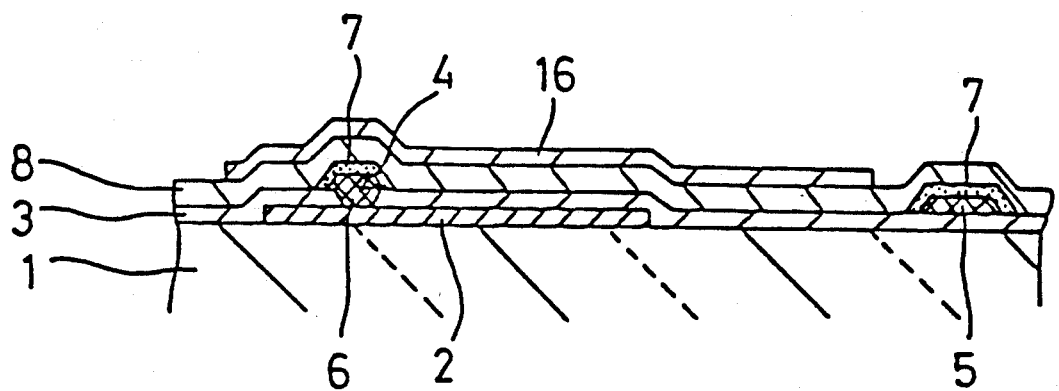
FIGS. 4B and 4C, respectively, are sectional views taken along lines B—B and C—C of FIG. 4A.
Figure 4C:
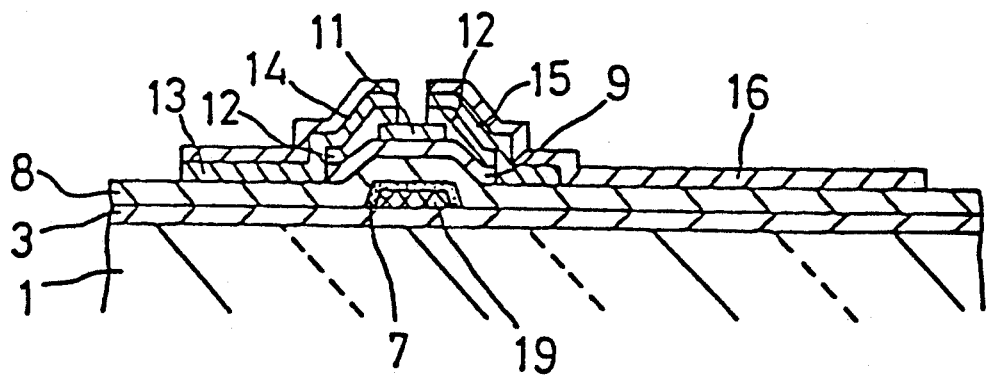

FIG. 4B and FIG. 4C, respectively, are cross sectional views taken along lines B—B and C—C of FIG. 4A. FIGS. 5A to 5D show a production process for the substrate in FIG. 4B.

Figure 5A:
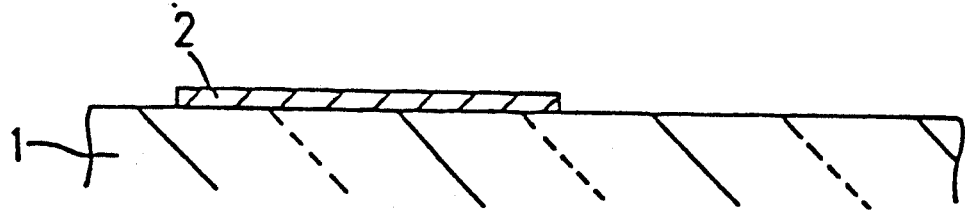
FIGS. 5A-5D are schematic diagrams showing a production process of the substrate of FIG. 4B.

A film, 500–2000 Å thick, was formed on a glass substrate 1 from ITO, $SnO_2$ or other transparent conductive material, and the added capacitance electrode wires 2 were formed by patterning this film in the prescribed shape (FIG. 5A). A base insulation film 3 made of $SiO_2$, $Ta_2O_5$ or $Al_2O_3$ was then laid over the entire surface of this substrate. When a material other than an oxide such as SiNx is used as the base insulation film 3, the added capacitance electrode wire 2 formed below the base insulation film 3 from a transparent conductive material is reduced during the production process and it loses its transparency, which is undesirable.

The thickness of the base insulation film 3 is set at about 1000 Å when a material with a small specific dielectric constant such as $SiO_2$ (the specific dielectric constant thereof being 4) is used, but the thickness can be greater when a material with a large specific dielectric constant such as $Ta_2O_5$ (the specific dielectric constant thereof being 23–25) is used. The base insulation film 3 can have a multilayer structure in which a nitride film or an oxide film of a different material is formed on the above-mentioned oxide film. When a multilayer structure is used for the base insulation film 3, the first layer that is in contact with the added capacitance electrode wire 2 below it must be formed using the oxide materials mentioned above for the same reason as mentioned above.

Figure 5B:
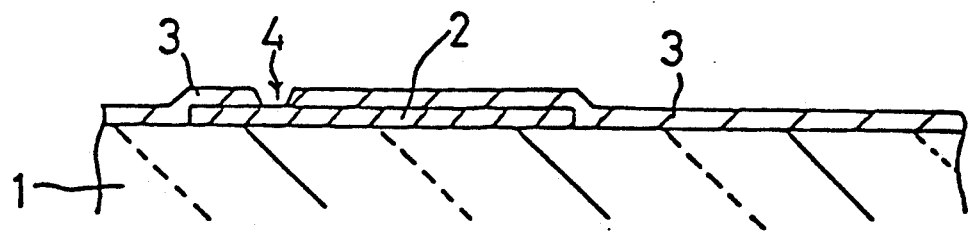
Figure 5C:
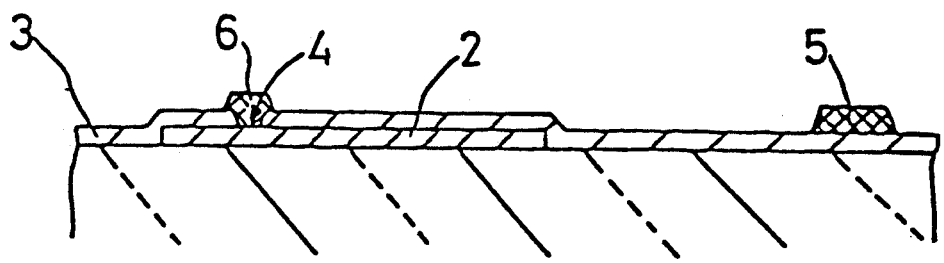
Figure 5D:
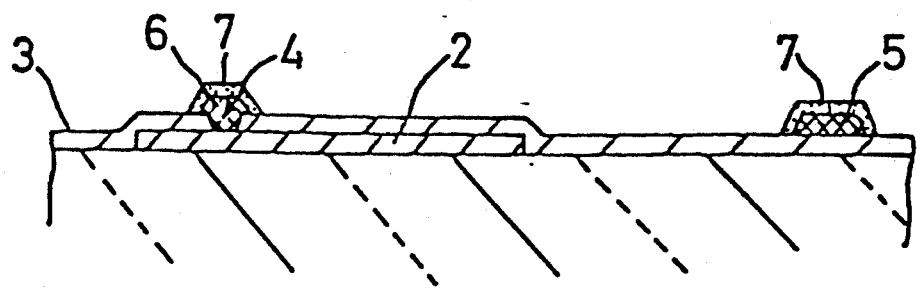

Next, the through-holes 4 were formed in the base insulation film 3 (FIG. 5B). The through-holes 4 are provided to electrically connect the added capacitance electrode wires 2 and the secondary wires 6 to be formed later. In this example, as shown in FIG. 4A, the through-holes 4 were made in two places, but they may also be a continuous groove shape. A metal film of Ta or the like, which is subject to anodic oxidation, was formed over the entire surface of the base insulation film 3 including holes 4, and this was then patterned into the prescribed shape by an etching technique to form the secondary wires 6, the gate electrode wires 5 and the gate electrodes 19 (FIG. 5C). At this time, the width of the secondary wires 6 must be wider than the through-holes 4 to prevent exposure of the added capacitance electrode wires 2. Patterns are selectively formed in this Ta metal film by a dry etching technique when the base insulation film 3 is a $SiO_2$ film and by a wet etching technique using a mixture of HF and $HNO_3$ when the base insulation film 3 is a $Ta_2O_5$ film.

Next, the anodic oxide film 7 is formed by anodic oxidation of the surface of the secondary wires 6, the gate electrode wires 5 (FIG. 5D) and the gate electrodes 19. The Ta metal undergoes anodic oxidation in an ammonium borate solution, a citric acid solution or an ammonium tartrate solution, so a $Ta_2O_5$ is formed on the surface of the Ta metal.

Moreover, a gate insulation film 8 of SiNx was laid over the entire surface of this substrate to form the picture element electrodes 16 and yield the configuration shown in FIG. 4B.

Figure 6A:
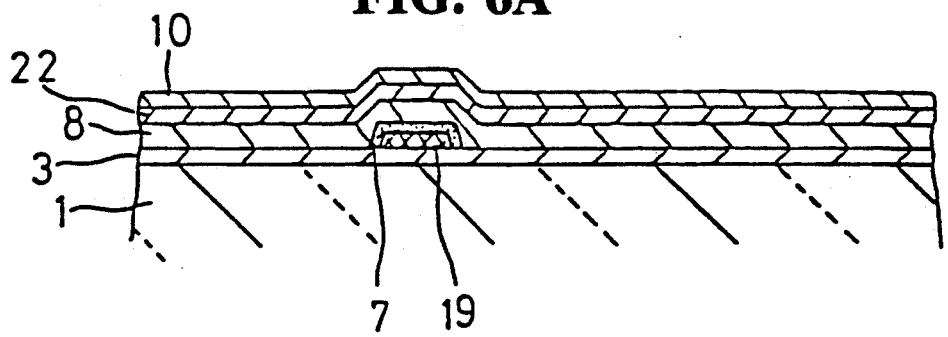
FIGS. 6A-6D are schematic diagrams showing a production process of the substrate of FIG. 4C.
Figure 6B:
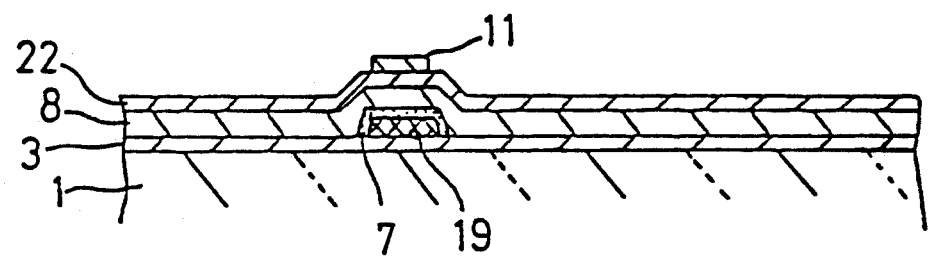

FIGS. 6A through 6d show a production process of the TFT 17 in FIG. 4C. An anodic oxide film 7 was formed on the top of the gate electrodes 19 as described above, and then a SiNx gate insulation film 8 was formed over the entire surface of the base insulation film 3 including the anodic oxide film 7. The entire surface of the substrate was then covered with an a-Si(i) layer 22 which serves as a semiconductor layer and a SiNx layer 10 which serves as an etching stop layer (FIG. 6A). The SiNx layer 10 was then patterned in the prescribed shape, except for a part positioned above the gate electrodes 19, so as to form the etching stop layer 11 (FIG. 6B).

Figure 6C:
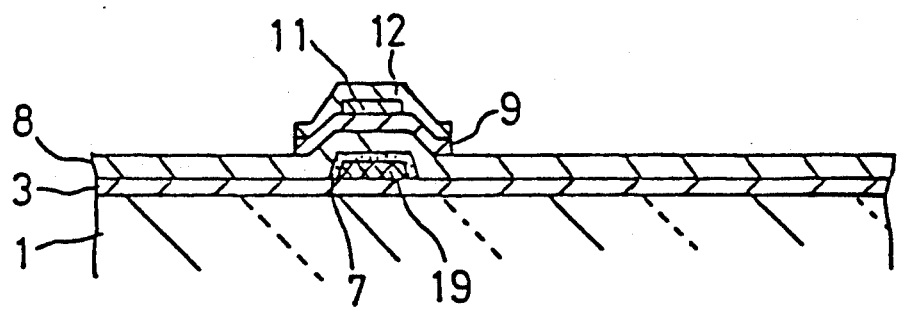

An a-Si(n+) layer 21 with a thickness of 1000 Å (not shown) covering the etching stop layer 11 was formed by the plasma CVD method over the entire surface of the a-Si(i) layer 22, the a-Si(n+) layer 21 later becoming a contact layer. Next, the a-Si(i) layer 22 and the a-Si(n+) layer 21 were patterned in the prescribed shape to form the semiconductor layer 9 and the contact layer 12 (FIG. 6C).

Figure 6D:
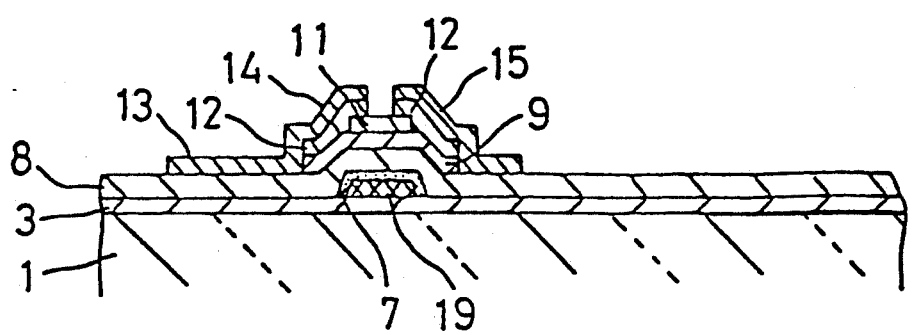

Ti, Mo or other metal was then laid over the entire surface of this substrate by spattering, and this metal film was patterned by an etching technique to form the source electrode wires 13, the source electrodes 14, and the drain electrodes 15. At this time, a portion of the contact layer 12 on the etching stop layer 11 was also removed by etching so the contact layer 12 was divided into the part below the source electrode 14 and the part below the drain electrode 15 (FIG. 6D).

An ITO film with a thickness of 1000 Å was then laid over the entire surface of the substrate by spattering. This ITO film was patterned in the prescribed shape to form the picture element electrodes 16. The ITO film that is positioned above the source electrode wires 13, the source electrodes 14 and the drain electrodes 15 was not removed in order to strengthen them (FIG. 4C).

In this example, an added capacitance is formed between each picture element electrodes 16 and part of the corresponding added capacitance electrode wire 2. The secondary wires 6 are connected electrically to the added capacitance electrode wires 2. Since an anodic oxide film 7 is formed on the top surface of the secondary wires 6 toward the picture element electrodes 16, the occurrence of insulation defects between the secondary wires 6 and the picture element electrodes 16 can be reduced. Moreover, since there are two insulation films, the base insulation film 3 and the gate insulation film 8, between the picture element electrodes 16 and the added capacitance electrode wires 2, the occurrence of insulation defects between the added capacitance electrode wires 2 and the picture element electrodes 16 can also be reduced.

EXAMPLE 3

This example is intended to solve the problem arising in Example 1, in which the active-matrix substrate provided with added capacitance electrode wires 91 with secondary wires 121, as explained in FIG. 2C and FIG. 2D, requires that the secondary wires 121 be connected to each other electrically, thus requiring an extra production process.

Figure 7:
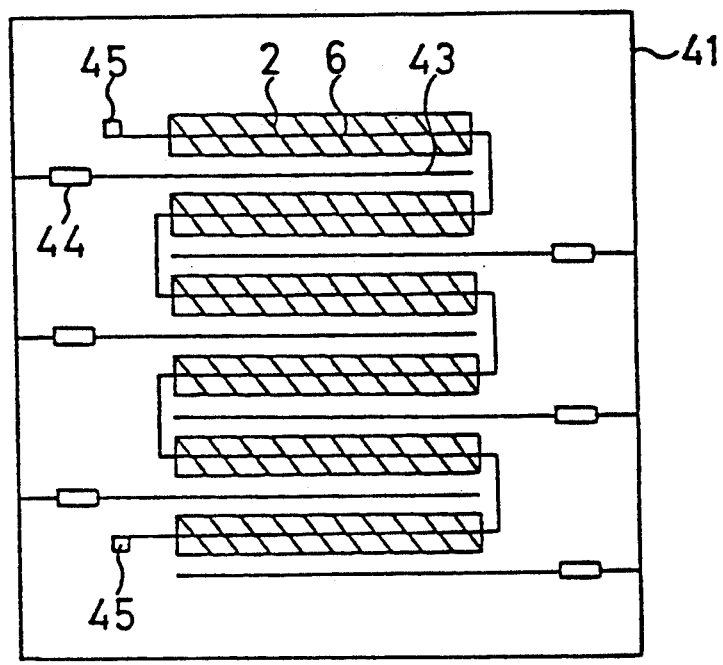
FIG. 7 is a plan view showing still another active-matrix substrate used in this invention.

FIG. 7 is a plan view showing the active-matrix substrate of this example in the course of the production. Gate electrode wires 43 that function as scanning lines, gate electrode terminals 44, a secondary wire 6, and a peripheral wire 41 are formed from a metal film on a glass substrate. Gate electrode wires 43 with gate electrode terminals at one end and gate electrode wires 43 with gate electrode terminals at the opposite ends were alternately disposed, and each of the gate electrode terminals 44 were connected to the peripheral wire 41. The peripheral wire 41 was positioned around the area where the gate electrode wires 43 and the secondary wire 6 were formed. An anodic oxide film formed by means of an anodic oxidation current passing through the peripheral wire 41 was positioned over each of the gate electrode wires 43. The secondary wire 6 was positioned in a zigzag manner between the gate electrode wires 43. Opposing electrode terminals 45 for connecting to the opposing electrodes were formed on both ends of the secondary wire 6. Added capacitance electrode wires 2 were formed from a transparent conductive material above those parts of the secondary wires 6 that were parallel to the gate electrode wires 43. For simplicity sake, the shape of the added capacitance electrode wire 2 is shown rectangular in FIG. 7. The configuration of the part where the added capacitance was formed in this example is the same as in the conventional example shown in FIG. 1B. A gate insulation film, picture element electrodes, TFTs, etc., were then formed to yield an active-matrix substrate.

In this example, a single continuous secondary wire 6 with no breaks was formed, so no process was required to electrically connect separate secondary wires as in the above-mentioned previous conventional example. In addition, when attempting to make the picture elements smaller and increase the density of the gate electrode wires 43 in the configuration of the above-mentioned conventional example, the wiring density was determined by the width of the gate electrode terminals since all of the gate electrode terminals were on one end of the gate electrode wires and the gate electrode terminals 44 were wider than the gate electrode wires 43. In this example, however, high density wiring could be achieved because the gate electrode terminals 44 were alternately disposed.

EXAMPLE 4

Figure 8A:
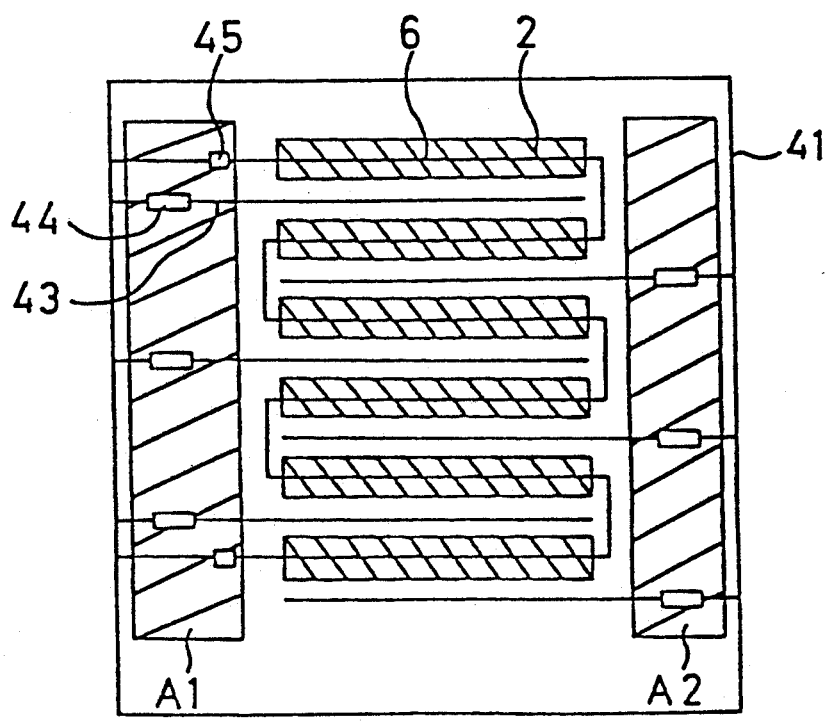
FIGS. 8A-8C, respectively, are plan views showing other active-matrix substrates used in this invention.

FIG. 8A is a plan view of the active-matrix substrate of this example in the course of production. This example differs from that of FIG. 7 in that the secondary wire 6 was connected to the peripheral wire 41. Moreover, the configuration of the part where the added capacitance was formed in this example was the same as the example shown in FIG. 4B, and an anodic oxide film was formed on the top of the secondary wire 6. By connecting the secondary wire 6 to the peripheral wire 41 in at least one place, anodic oxidation could be performed on the secondary wire 6 at the same time as the gate electrode wires 43. Anodic oxidation was performed by forming a resist on the areas indicated by A1 and A2 using a printing technique or the like and then immersing the substrate in an anodic oxidation solution and applying a voltage thereto via the peripheral wire 41.

A single, continuous secondary wire 6 with no breaks was also formed in this example, so no process was required to electrically connect the secondary wires as in the above-mentioned conventional example. Also, few connections with the peripheral wire 41 are required to perform anodic oxidation, so high-density wiring is possible. Moreover, high-density wiring can also be achieved by alternately disposing the gate electrode terminals 44.

EXAMPLES 5 AND 6

Figure 8B:
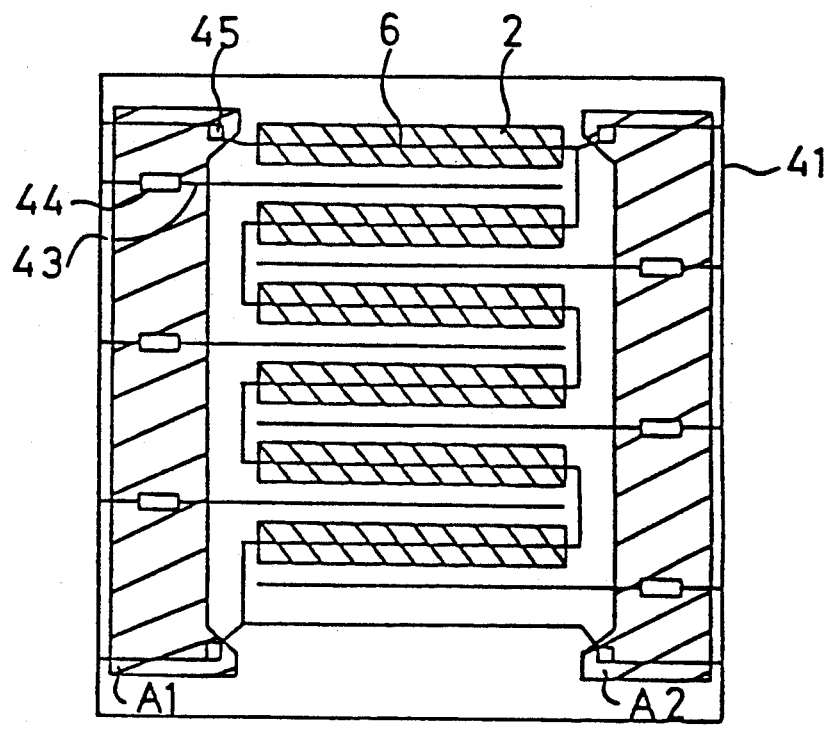
Figure 8C:
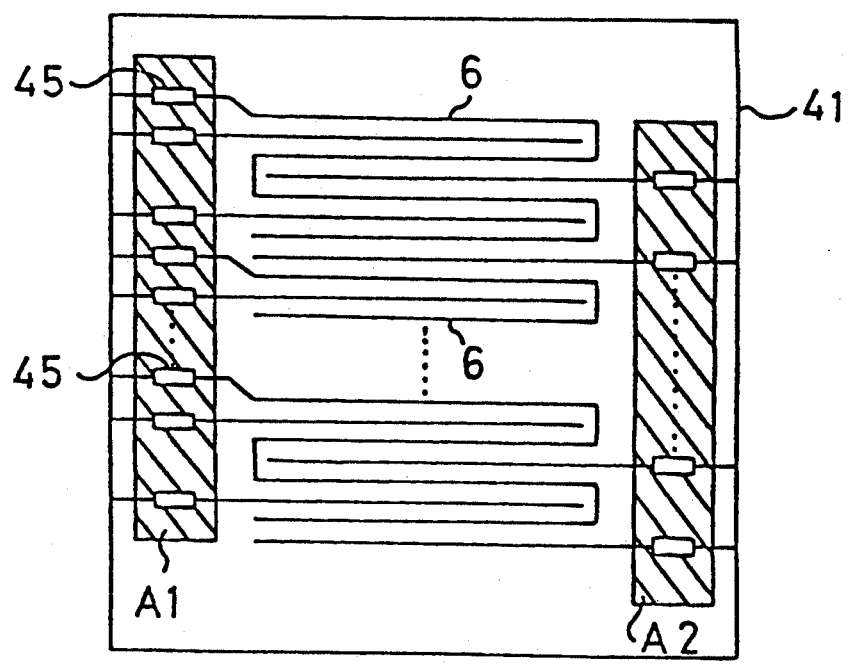
Figure 9A:
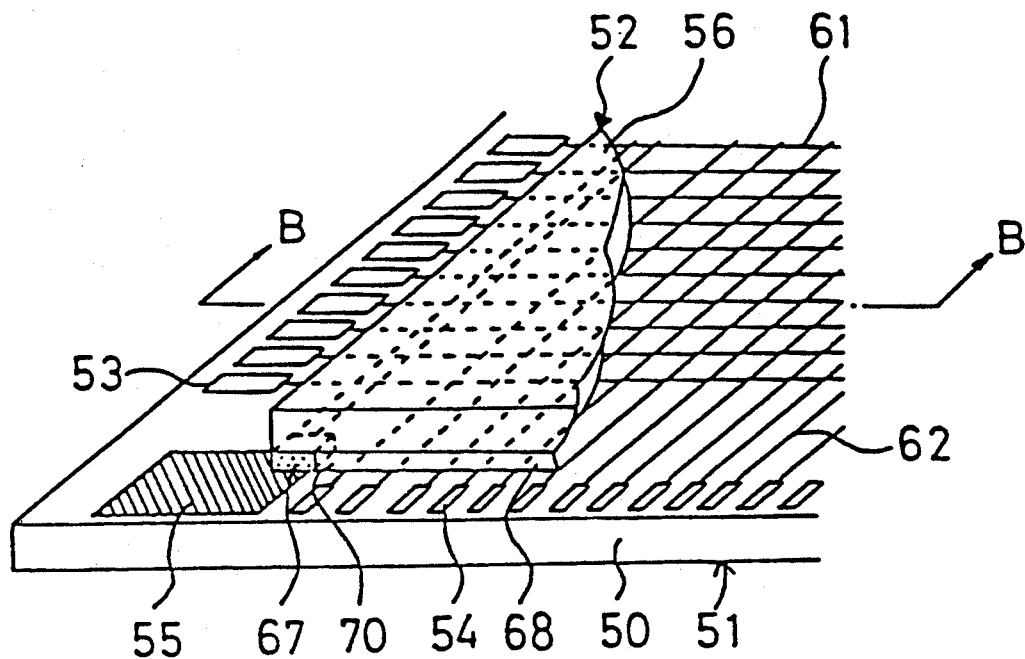
FIG. 9A is a perspective view showing a conventional active-matrix display device.
Figure 9B:
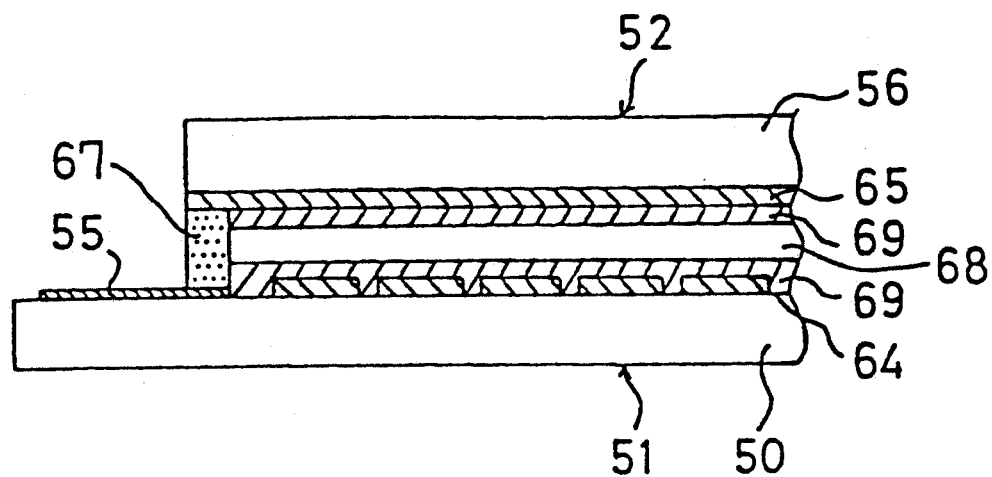
FIG. 9B is a sectional view taken along line B—B of FIG. 9A.
Figure 9C:
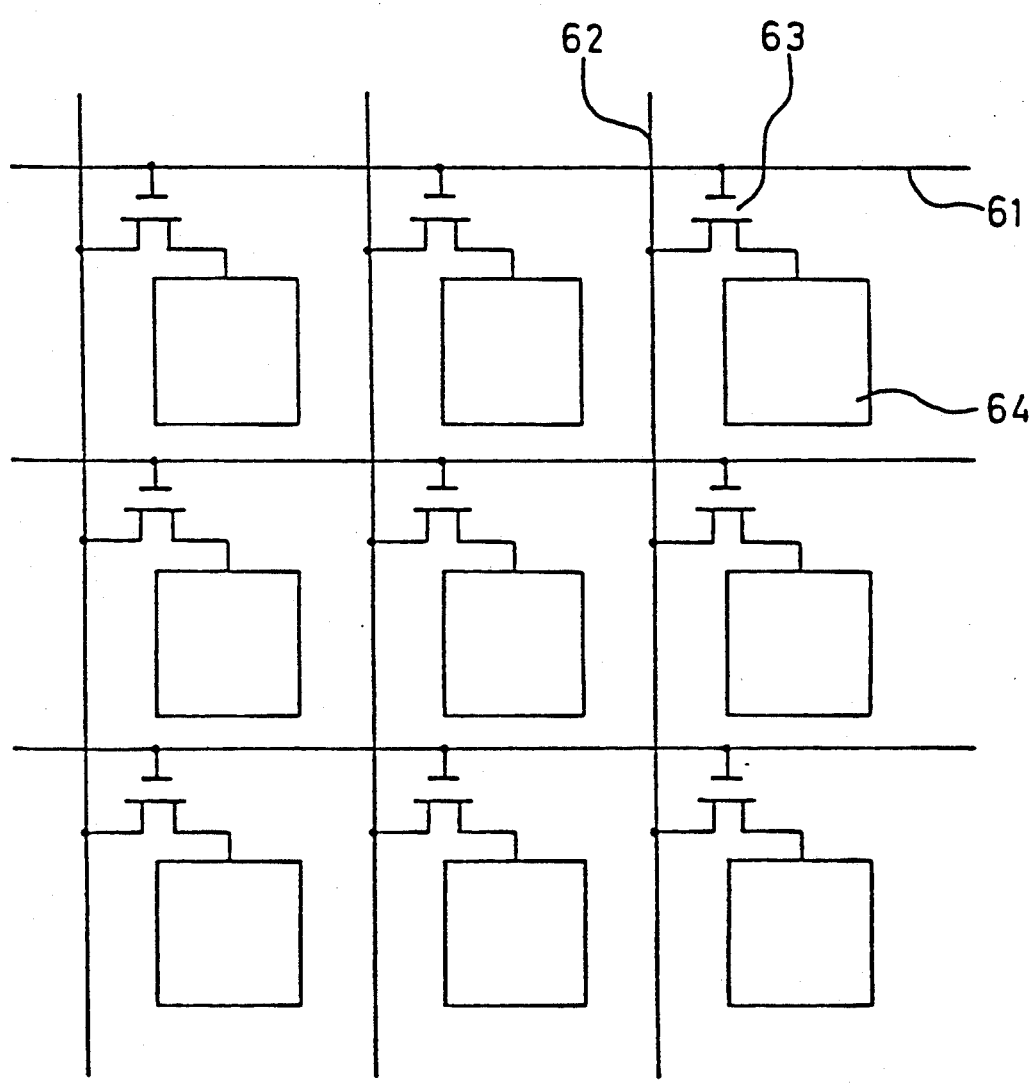
FIG. 9C is a schematic diagram showing the substrate of FIG. 9A.
Figure 10:
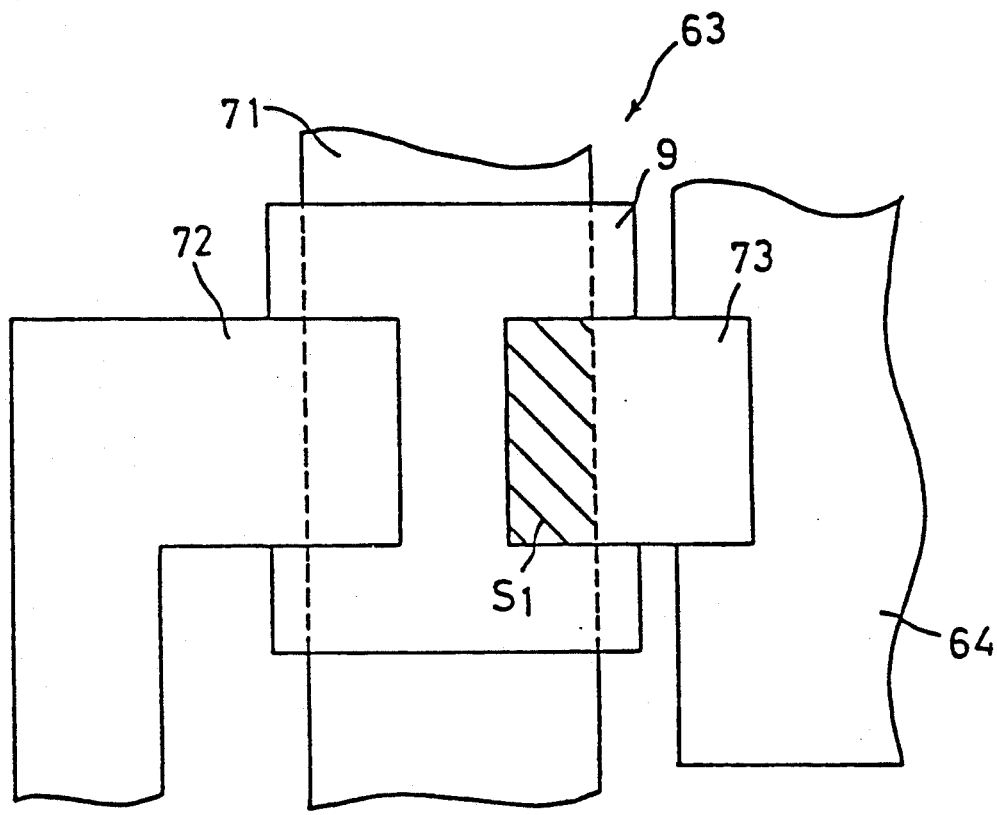
FIG. 10 is a plan view showing a region of the TFT in the substrate shown in FIG. 9A.
Figure 11:
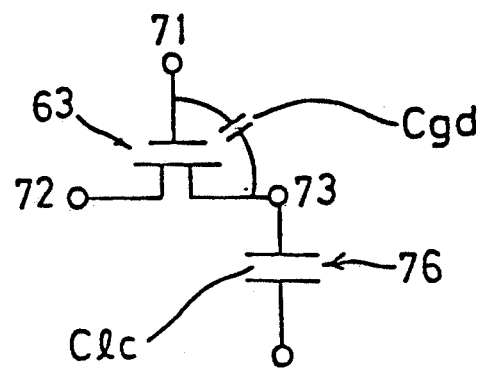
FIG. 11 is an equivalent circuit diagram of the TFT of FIG. 10.
Figure 13:
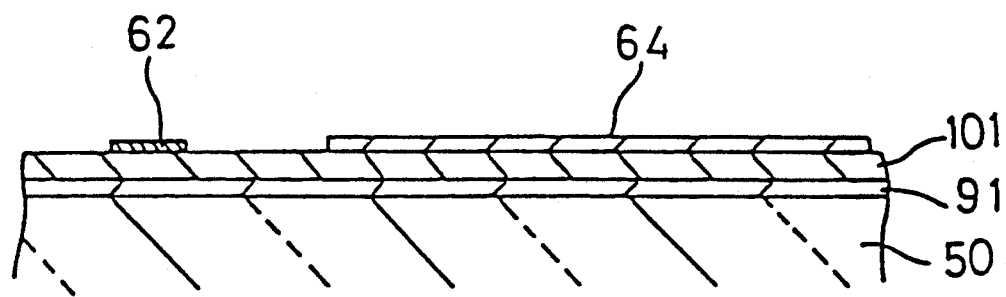
FIGS. 13 and 14, respectively, are sectional views taken along lines P—P and Q—Q of FIG. 12.
Figure 14:
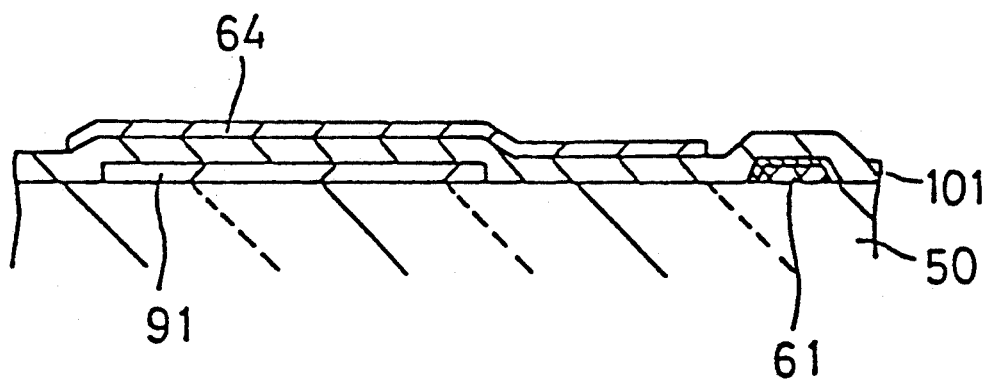

As shown in FIG. 8B, a configuration is also possible in which the secondary wire 6 is connected to the opposing electrode terminals 45 in four places. As shown in FIG. 8C, a configuration is also possible in which the secondary wire is divided up into multiple wires, each of the secondary wires 6 has an opposing electrode terminal 45, and the opposing electrode terminals 45 are connected to the peripheral wire 41.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An active-matrix display device comprising a pair of insulation substrates that face each other, picture element electrodes that are arranged in a matrix on an inner surface of one of said substrates, an added capacitance electrode wire made of a transparent conductive film that faces each of said picture element electrodes with at least one insulation film sandwiched therebetween, and a secondary wire that is disposed above said added capacitance electrode wire with an insulation film sandwiched therebetween, said insulation film having at least a connection groove by which said added capacitance electrode wire and said secondary wire are electrically connected to each other, an anode oxidation film being formed on said secondary wire and gate electrodes formed on said insulation film.

2. An active-matrix device according to claim 1 wherein the said gate electrodes are made of the same metal as that of the said secondary wire, and the said metal can be anodized.

3. An active-matrix display device comprising a pair of insulation substrates, a number of scanning lines that are disposed in a parallel manner on an inner surface of one of said substrates, a connection terminal that is formed at one end of each of said scanning lines, a number of added capacitance electrode wires each of which have electrical resistance and are arranged in a parallel manner between the adjacent scanning lines, said added capacitance electrode wires being made of a transparent conductive film, and a secondary wire for reducing the electric resistance of said added capacitance electrode wires, wherein said scanning lines each of which is electrically connected to a connection terminal at its one end are disposed alternatively in the opposite direction in a parallel manner, and said secondary wire is composed of first parts that are electrically connected to said corresponding added capacitance electrode wires so as to be parallel to said scanning lines and second parts that electrically connect with said first parts of said secondary wire so that said secondary wire is positioned in a zigzag manner.

4. An active-matrix display device according to claim 3, wherein said secondary wire is positioned to be divided into plural portions.

* * * * *